(12) United States Patent
Ohkawa

(10) Patent No.: US 6,656,755 B1
(45) Date of Patent: Dec. 2, 2003

(54) METHOD FOR MANUFACTURING SEMICONDUCTOR DEVICE BY POLISHING

(75) Inventor: Makoto Ohkawa, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/709,456

(22) Filed: Nov. 13, 2000

(30) Foreign Application Priority Data

Nov. 17, 1999 (JP) ............................................ 11-326932

(51) Int. Cl.$^7$ ................................................ H01L 21/00
(52) U.S. Cl. ........................................................ 438/16
(58) Field of Search .............................. 438/16, 14–15, 438/17–18, 7–9, 800, 691–693; 451/6, 67

(56) References Cited

U.S. PATENT DOCUMENTS

| | | | |
|---|---|---|---|
| 3,744,916 A | * 7/1973 | Bey et al. ................... | 356/161 |
| 5,081,796 A | 1/1992 | Schultz | |
| 5,838,448 A | * 11/1998 | Aiyer et al. | |
| 5,893,796 A | 4/1999 | Birang et al. | |
| 5,964,643 A | 10/1999 | Birang et al. | |
| 6,045,439 A | 4/2000 | Birang et al. | |
| 6,142,855 A | * 11/2000 | Nyui et al. .................. | 451/67 |
| 6,190,234 B1 | * 2/2001 | Swedek et al. ................ | 451/6 |
| 6,261,152 B1 | 7/2001 | Aiyer | |

FOREIGN PATENT DOCUMENTS

| | | |
|---|---|---|
| JP | A-2000-354961 | 12/1900 |
| JP | 11-33901 | 5/1989 |
| JP | 5-234971 | 9/1993 |
| JP | 5-308096 | 11/1993 |
| JP | 5-309558 | 11/1993 |
| JP | A-7-4921 | 1/1995 |
| JP | 8-216016 | 8/1996 |
| JP | 8-316179 | 11/1996 |
| JP | 9-162087 | 6/1997 |
| JP | A-2000-9437 | 1/2000 |
| JP | 2000-35316 | 2/2000 |
| JP | 2000-353316 | 2/2000 |

OTHER PUBLICATIONS

Shio, "Development of Optical in–situ End Detection Mechanism".

U.S. Pat. application Ser. No. 09/616,372, Komura, filed Jul. 13, 2000.

U.S. Pat. application Ser. No. 09/118,306 (corr. to JP 2000–35316).

* cited by examiner

*Primary Examiner*—Craig Thompson
(74) *Attorney, Agent, or Firm*—Posz & Bethards, PLC

(57) ABSTRACT

When an SOI substrate composed of a support wafer and an element formation wafer that are bonded together with an insulating film interposed therebetween is polished from a surface of the element formation wafer, a thickness of the element formation wafer is measured based on a relation between an intensity and a wavelength of a light that is irradiated to the SOI substrate from a side of the support wafer and is reflected by the SOI substrate. Thus, the measurement of the thickness of the element formation wafer can be performed simultaneouly with the polishing of the SOI substrate.

9 Claims, 1 Drawing Sheet

METHOD FOR MANUFACTURING SEMICONDUCTOR DEVICE BY POLISHING

CROSS REFERENCE TO RELATED APPLICATION

This application is based upon and claims the benefit of Japanese Patent Application No. 11-326932 filed on Nov. 17, 1999, the contents of which are incorporated herein by reference.

BACKGROUND OF THE INVENTION

1. Field of the Invention

This invention relates generally to a method for manufacturing a semiconductor device, and particularly to a method for manufacturing an SOI (Silicon On Insulator) substrate.

2. Description of the Related Art

In an SOI substrate in which an element formation wafer and a support wafer are bonded together, an SOI layer having a required thickness is provided by polishing a surface of the element formation wafer after bonding the two wafers with an oxide film interposed therebetween. As a conventional polishing method for the SOI substrate, a thickness of the SOI layer is measured after polishing is carried out for a predetermined time, and this polishing and measurement are repeated until the SOI layer has a required thickness. In this method, however, the polishing process must be stopped and the SOI substrate must be detached from a polishing apparatus every time the thickness is measured. Thus, complicated work is required. Besides, because the measurement is not performed continuously, a failure occurrence rate is liable to be increased due to excessive polishing.

SUMMARY OF THE INVENTION

The present invention has been made in view of the above problems. An object of the present invention is to provide a method for measuring a thickness of an SOI layer when an SOI substrate is polished.

According to the present invention, when a surface of a semiconductor substrate, which is composed of a first layer and a second layer having different refractive indexes from each other, is polished at a side of the first layer, a thickness of the first layer is measured based on a relation between an intensity and a wavelength of a light that is irradiated to the substrate and is reflected by the substrate at a side of the second layer.

Thus, since the thickness of the first layer can be measured by light irradiated to and reflected from the substrate, the thickness can be measured when the surface of the substrate is polished. The substrate may be an SOI substrate having a semiconductor layer as the first layer and an oxide layer as the second layer.

The surface of the substrate can be polished by a polishing machine that is composed of a wafer support head having an attachment surface for holding the substrate, and a pad that is disposed to face the attachment surface for polishing the SOI substrate. The attachment surface may have a window portion penetrating the wafer support head for allowing the light to be irradiated to the substrate from the side of the wafer support head when the substrate is attached to the attachment surface.

BRIEF DESCRIPTION OF THE DRAWINGS

Other objects and features of the present invention will become more readily apparent from a better understanding of the preferred embodiment described below with reference to the following drawings, in which.

DETAILED DESCRIPTION OF THE PREFERRED EMBODIMENT

Figure 1:
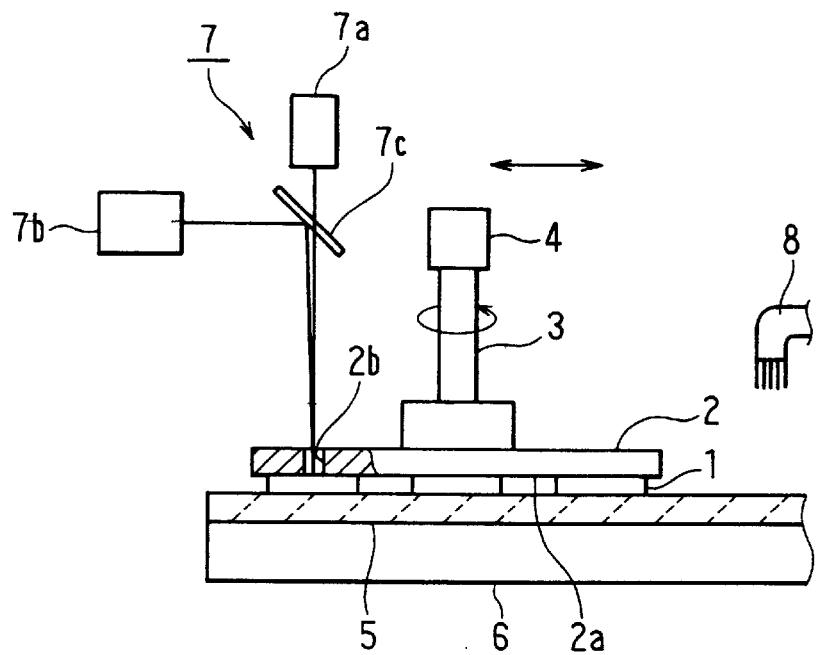
FIG. 1 is a schematic view showing a CMP (Chemical Mechanical Polishing) machine to which a preferred embodiment of the present invention is applied.

As shown in FIG. 1, a CMP machine has a wafer support head 2 for supporting several SOI substrates 1 thereon. The wafer support head 2 has a disk shape, and the several SOI substrates 1 are attached to an attachment surface 2a of the disk-shaped wafer support head 2. For example, one of the SOI substrates 1 is attached to the central position of the wafer support head 2, and the other SOI substrates 1 are attached to surround the SOI substrate 1 on the central position.

The wafer support head 2 is connected to a drive shaft 3 at the center thereof, and is such constructed that it can be rotated via the drive shaft 3. A torque of the drive shaft 3 is monitored by a torque sensor 4 and can be controlled appropriately. The wafer support head 2 is located on a base 6 having a pad 5 for wafer polishing so that the surfaces of the SOI substrates 1, which are attached to the attachment surface 2a, are brought in close contact with the pad 5. The wafer support head 2 is so constructed that it can appropriately move on the base 6 in any directions parallel to the pad surface. Therefore, the wafer support head 2 can move above the pad surface while being driven to rotate by the drive shaft 3.

Further, a window portion 2b is formed to pass through the wafer support head 2 at a location where one of the SOI substrate 1 is disposed, and the surface of the wafer can be measured through the window portion 2b. The wafer support head 2 has only to have one window portion 2b; however, the wafer support head 2 may have plural window portions 2b at all of the locations where the SOI substrates 1 are respectively attached to surround the central position of the attachment surface 2a.

Above the base 6, a slurry supply source 8 is provided and supplies slurry as an abrasive solution onto the surface of the pad 5. Besides, the CMP machine has a thickness measurement unit 7 for measuring a thickness of an SOI layer. The thickness measurement unit 7 is composed of a light source 7a for irradiating infrared light to the surface of the SOI substrate 1 through the window portion 2b, a thickness measurement portion 7b for measuring the thickness of the SOI layer by receiving light reflected by the SOI substrate 1, and a mirror 7c for conducting the light reflected by the SOI substrate 1 to the thickness measurement portion 7b.

Figure 2:
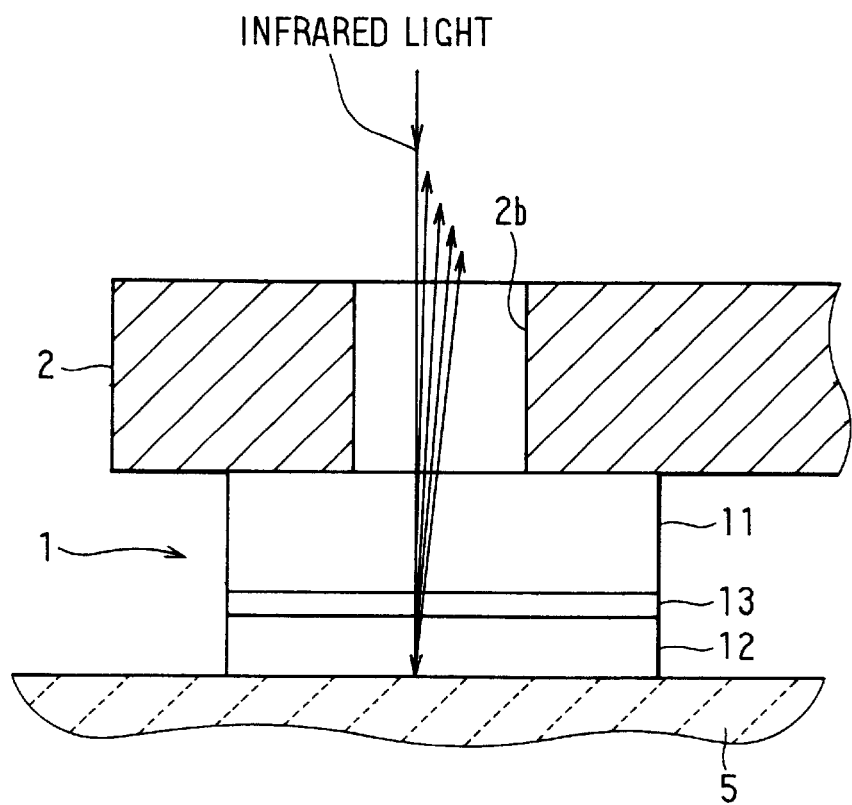
FIG. 2 is a schematic cross-sectional view for explaining a state where infrared light is irradiated to an SOI substrate shown in FIG. 1.

FIG. 2 shows an enlarged view showing a vicinity of the SOI substrate 1 when the surface of the SOI substrate 1 is irradiated with infrared light entering through the window portion 2b. As shown in FIG. 2, the SOI substrate 1 is composed of a support wafer 11 and an element formation wafer 12 that are bonded together with an oxide film 13 interposed therebetween. In this SOI substrate 1, the surface at the side of the support wafer 11 is attached to the attachment surface 2a of the wafer support head 2. Then, infrared light incident on the SOI substrate 1 through the window portion 2b is reflected successively by the surface of the support wafer 11, the interface between the support wafer 11 and the oxide film 13, the interface between the oxide film 13 and the element formation wafer 12, and the surface of the element formation wafer 12 where two parts having different refractive indexes contact each other. The reflected lights are conducted to the thickness measurement portion 7b by the mirror 7c.

Incidentally, light that is to be incident on the SOI substrate 1 is required to have a wavelength with which the light can penetrate silicon, and is less liable to be absorbed by silicon and the oxide film. Therefore, although it is not shown, light having the wavelength fulfilling the above conditions is generated by providing a reflection preventive film on an edge face of a semiconductor laser, taking light out to an external resonator, and changing an angle of light by an interference filter disposed on the way of the external resonator. For example, when a wafer having an impurity concentration of $1 \times 10^{18}$ cm$^{-3}$ or more is used as the support wafer 11, in consideration of an effect by absorption of free carriers indicated by formula (1), infrared light having a wavelength of about 1 to 3 $\mu$m (more preferably, about 1.1 to 1.6 $\mu$m) is used, and the wavelength is varied.

$$\alpha_{fc} = \left(\frac{\lambda^2 q^3}{4\pi^2 c^3 n^* \epsilon_0}\right) \cdot \left(\frac{N}{m^2 \mu}\right) \quad (1)$$

where $\alpha_{fc}$ is absorption coefficient, $\lambda$ is wavelength of light, N is impurity concentration, m is effective mass of a free carrier, $\mu$ is mobility of the free carrier, q is charge of an electron, c is luminous flux, n* is a real number of refractive index of Si, and $\epsilon_0$ is vacuum dielectric constant.

In the thickness measurement portion 7b, Fourier analysis is performed to the intensity-wavelength characteristics of reflected light, and the thickness of the SOI layer that is formed by thinning the element formation wafer 12 is measured. According to the construction described above, the polishing state of the SOI substrate 1 can be measured successively, and the SOI substrate 1 needs not be detached from the polishing machine every time the thickness of the SOI layer is measured. Thus, the thickness of the SOI layer can be measured easily.

By using the SOI substrate manufactured as described above, a semiconductor device including semiconductor elements integrated together and being made dielectric-isolation mutually can be manufactured by performing trench formation and element formation to the side of the element formation wafer 12 of the SOI substrate by well-known methods.

The window portion may be opened at the base side for measurement, and infrared light may be irradiated through the window portion. In this case, however, the window portion should penetrate the pad. When the pad has such hole, the polished surface of the SOI substrate, i.e., the surface of the element formation wafer might be damaged to affect element characteristics. Therefore, providing the window portion in the support head 2 as in the aforementioned embodiment is preferable. Besides, when the thickness is measured by irradiating infrared light to the surface opposite to the surface of the SOI substrate 1 that is polished, the infrared light incident thereon is not affected by slurry, the polished surface, and the like. As a result, the measurement accuracy becomes high.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing a semiconductor device, comprising:

preparing a semiconductor substrate having a first layer and a second layer each having a different refractive index; and polishing a surface of the semiconductor substrate at a side of the first layer while measuring a thickness of the first layer based on a relation between an intensity and a wavelength of light that is irradiated onto the second layer of the semiconductor substrate and is reflected by the semiconductor substrate at respective first and second sides of the first and second layers, wherein the light is irradiated while varying the wavelength of the light.

2. A method for manufacturing a semiconductor device, comprising:

preparing an SOI substrate composed of a support wafer and an element formation wafer that are bonded together with an insulating film interposed therebetween;

polishing a surface of the SOI substrate at a side of the element formation wafer; and measuring a thickness of the element formation wafer that is polished from the surface as an SOI layer, based on a relation between an intensity and a wavelength of light that is irradiated onto the SOI substrate from a side of the support wafer and that is reflected by respective surfaces of the support and element formation wafers, wherein the light is irradiated while varying the wavelength of the light.

3. The method according to claim 2, wherein the surface of the SOI substrate is polished by:

preparing a polishing machine composed of a wafer support head having an attachment surface for holding the SOI substrate, and a pad that is disposed to face the attachment surface for polishing the SOI substrate, the attachment surface having a window portion penetrating the wafer support head;

attaching the SOI substrate to the attachment surface at the side of the support wafer so that the SOI substrate covers the window portion;

bringing the surface of the SOI substrate at the side of the element formation wafer in contact with the pad; and polishing the surface of the element formation wafer; and wherein the thickness of the element formation wafer is measured by irradiating the light to the SOI substrate through the window portion of the wafer support head.

4. The method according to claim 1, wherein the polishing of a surface of the semiconductor substrate at a side of the first layer while measuring a thickness of the first layer based on a relation between an intensity and a wavelength of light that is irradiated onto the second layer of the semiconductor substrate and is reflected by the semiconductor substrate at respective first and second sides of the first and second layers comprises:

polishing a surface of the semiconductor substrate at a side of the first layer while measuring a thickness of the first layer based on a relation between an intensity and a wavelength of infrared light that is irradiated onto the second layer of the semiconductor substrate and is reflected by the semiconductor substrate at respective first and second sides of the first and second layers.

5. The method according to claim 2, wherein the measuring of a thickness of the element formation wafer that is polished from the surface as an SOI layer, based on a relation between an intensity and a wavelength of light that is irradiated onto the SOI substrate from a side of the support wafer and that is reflected by respective surfaces of the support and element formation wafers comprises measuring a thickness of the element formation wafer that is polished from the surface as an SOI layer, based on a relation between an intensity and a wavelength of infrared light that is irradiated onto the SOI substrate from a side of the support wafer and that is reflected by respective surfaces of the support and element formation wafers.

6. The method according to claim 3, wherein the irradiating of the light to the SOI substrate through the window portion of the wafer support head comprises irradiating infrared light to the SOI substrate through the window portion of the wafer support head.

7. The method according to claim 2, wherein the measuring of a thickness of the element formation wafer that is polished from the surface as an SOI layer, based on a relation between an intensity and a wavelength of light that is irradiated onto the SOI substrate from a side of the support wafer and that is reflected by respective surfaces of the support and element formation wafers comprises measuring a thickness of the element formation wafer that is polished from the surface as an SOI layer based on a relation between an intensity and a wavelength of light that is irradiated onto the SOI substrate from a side of the support wafer and that is reflected at respective first and second surfaces of the support and element formation wafers.

8. A method for manufacturing a semiconductor device, comprising:

preparing a semiconductor substrate having a first side and a second side; and polishing a surface of the semiconductor substrate at the first side while measuring a thickness of the substrate based on a light that is irradiated to the first side through the second side and is reflected from the second side; and varying a wavelength of the light while the light is irradiated.

9. The method of claim 8, wherein the polishing of a surface of the semiconductor substrate includes:

preparing a polishing machine composed of a wafer support head having an attachment surface for fixedly holding the semiconductor substrate thereto, a pad that is disposed opposite the attachment surface through the semiconductor substrate for polishing the semiconductor substrate, the attachment surface having a window portion extending through the wafer support head;

attaching the semiconductor substrate to the attachment surface at the second side so that the semiconductor substrate covers the window portion;

polishing a surface of the semiconductor substrate at the first side, wherein the thickness of the semiconductor substrate is measured by irradiating the light to the semiconductor substrate through the window portion of the wafer support head.

* * * * *